(12) United States Patent
Tramoni

(10) Patent No.: US 10,749,576 B2
(45) Date of Patent: Aug. 18, 2020

(54) EVALUATION OF AN AVERAGE POWER CONSUMPTION OF AN ELECTRONIC CIRCUIT

(71) Applicant: STMicroelectronics (Rousset) SAS, Rousset (FR)

(72) Inventor: Alexandre Tramoni, Le Beausset (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 16/545,115

(22) Filed: Aug. 20, 2019

(65) Prior Publication Data

US 2020/0076477 A1 Mar. 5, 2020

(30) Foreign Application Priority Data

Aug. 31, 2018 (FR) ..................................... 18 57857

(51) Int. Cl.
*H04B 5/00* (2006.01)
*H03K 3/03* (2006.01)
*H02M 7/06* (2006.01)

(52) U.S. Cl.
CPC ............ *H04B 5/0081* (2013.01); *H02M 7/06* (2013.01); *H03K 3/0315* (2013.01)

(58) Field of Classification Search
CPC ...... H04B 5/0081; H02M 7/06; H03K 3/0315

USPC ......................................................... 455/41.1
See application file for complete search history.

(56) References Cited

U.S. PATENT DOCUMENTS

| 9,362,930 B1 | 6/2016 | Kim |
| 2003/0056124 A1 | 3/2003 | Amick et al. |
| 2007/0108297 A1* | 5/2007 | Bates ................. G06K 19/0707 235/492 |
| 2015/0204917 A1 | 7/2015 | Priel et al. |
| 2016/0320446 A1 | 11/2016 | Huang |
| 2019/0090957 A1* | 3/2019 | De Wijs ............... A61B 8/0841 |

FOREIGN PATENT DOCUMENTS

GB 2415055 A 12/2005

\* cited by examiner

*Primary Examiner* — Lee Nguyen
(74) *Attorney, Agent, or Firm* — Slater Matsil, LLP

(57) ABSTRACT

A device includes an electronic circuit and a voltage-controlled oscillator configured to receive information representative of a power supply voltage of the device. The voltage-controlled oscillator is coupled to the electronic circuit. A first counter is configured to count pulses supplied by the voltage-controlled oscillator and a second counter is configured to count pulses of a clock signal. The device is configured to estimate an average power of the electronic circuit based on the pulses counted by the first counter.

20 Claims, 3 Drawing Sheets

EVALUATION OF AN AVERAGE POWER CONSUMPTION OF AN ELECTRONIC CIRCUIT

CROSS-REFERENCE TO RELATED APPLICATIONS

This application claims priority to French Patent Application No. 1857857, filed on Aug. 31, 2018, which application is hereby incorporated herein by reference.

This application is related to French Patent Application No. 1857859, filed on Aug. 31, 2018, which application is hereby incorporated herein by reference.

TECHNICAL FIELD

The present disclosure generally concerns the evaluation of an average power consumption of an electronic circuit.

BACKGROUND

Communication systems comprising electromagnetic transponders are more and more frequent, particularly since the development of near-field communication technologies according to ISO standard 14493 or the NFC forum.

Such systems use a radio frequency electromagnetic field emitted by a device (terminal or reader) to communicate with another device (card).

To optimize the quality of the communication, the resonance frequency of an oscillating circuit of the device detecting a field is generally adjusted (tuned) due to capacitive and/or resistive elements having settable values.

SUMMARY

The present disclosure generally concerns electronic circuits and, in particular embodiments, circuits powered from a source of power having a variable average amplitude. Particular embodiments of the present disclosure more apply to electronic devices integrating a near-field communication (NFC) circuit.

Embodiments can improve near-field communication devices, for example, to take into account amplitude variations of the voltage sampled across an oscillating circuit excited by an electromagnetic field.

Embodiments can provide an estimation and/or for a measurement of an average power consumption of a device having a variable power source.

Embodiments can decrease all or part of the disadvantages of known circuits.

An embodiment provides a device of estimation of an average power consumption of an electronic circuit. A voltage-controlled oscillator receives information representative of a power supply voltage of the circuit. A first counter of pulses is supplied by the voltage-controlled oscillator. A second counter counts pulses of a clock signal.

According to an embodiment, outputs of the counters are compared by a digital interpretation circuit.

According to an embodiment, the second counter outputs a reference count.

According to an embodiment, the counting time is conditioned by the second counter and determines the time period over which the power consumption is averaged.

According to an embodiment, the device further comprises a comparator of information representative of the power supply voltage of the circuit with respect to a reference value.

An embodiment provides a near-field communication device comprising an oscillating circuit, a bridge rectifying the voltage across the oscillating circuit, and a device of estimation of an average power consumption of an electronic circuit. The oscillator is powered and controlled by a voltage that is a function of an output voltage of the rectifying bridge.

According to an embodiment, the device further comprises a circuit of regulation of said output voltage of the rectifying bridge.

According to an embodiment, the device further comprises a circuit limiting the voltage across the oscillating circuit.

An embodiment provides a method of estimating the power consumption of an electronic circuit, by estimating the frequency of an oscillator voltage-controlled by a voltage representative of the circuit voltage.

According to an embodiment, a count output by a counter of pulses supplied by the oscillator is estimated with respect to a reference count.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
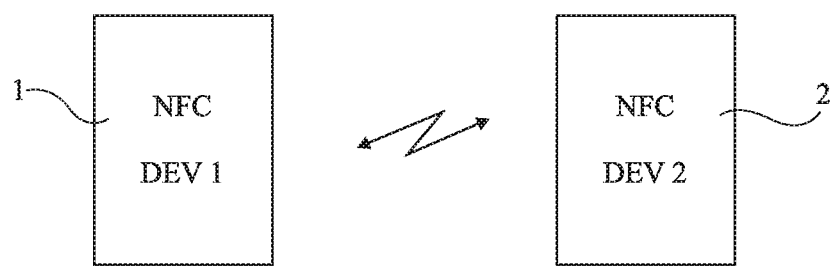
FIG. 1 very schematically shows in the form of blocks an example of a near-field communication system of the type to which the described embodiments apply.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the applications of near-field communication devices have not been detailed, the described embodiments being compatible with usual applications of such devices. Further, since the described embodiments more particularly target the transponder or the device excited by a magnetic field, the operation of the electromagnetic field generation terminal has not been detailed, the described embodiments being compatible with usual operations.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

The described embodiments take as an example an application to near-field communication devices. However, these embodiments more generally apply to any system where the power consumption of the circuits is desired to be estimated and/or regulated.

FIG. 1 is a very simplified representation in the form of blocks of an example of a near-field communication system of the type to which the described embodiments apply as an example.

Although the case of two similar electronic devices, for example, two cellular phones, is assumed, all that will be described more generally applies to any system where a transponder detects an electromagnetic field radiated by a reader or terminal. For simplification, reference will be made to NFC devices to designate electronic devices integrating near-field communication circuits.

Two NFC devices 1 (NFC DEV1) and 2 (NFC DEV2) are capable of communicating by near-field electromagnetic coupling. According to applications, for a communication, one of the devices operates in so-called reader mode while the other operates in so-called card mode, or the two devices communicate in peer-to-peer mode (P2P). Each device comprises various electronic circuits, among which a circuit forming a near-field communication interface, or NFC interface, between the NFC device and the outside. Such an interface is used, among others, in reader mode, to generate a radio frequency signal transmitted by means of an antenna and, in card mode, to decode a captured radio frequency signal. The radio frequency field generated by one of the devices is detected by the other device, which is located within its range and which also comprises an antenna.

For simplification, reference will be made hereafter to a terminal to designate a device emitting an electromagnetic field (for example, an electronic tag readout terminal, an NFC device operating in reader mode, etc.) and to a transponder to designate a device intended to capture this field (for example, an electronic tag, an NFC device operating in card mode, etc.)

A transponder comprises an antenna forming part of an oscillating circuit (for example, a parallel oscillating circuit formed of the antenna and of a capacitive element in parallel) intended to be excited in the presence of an electromagnetic field. The oscillating circuit is generally tuned to an excitation frequency of an oscillating circuit of a terminal intended to generate the electromagnetic field. For example, the oscillating circuits are tuned to a frequency of 13.56 MHz. The communication in the terminal-to-transponder direction is generally achieved by modulation of the amplitude and/or of the phase of the radiofrequency signal generated by the terminal, and thus of the electromagnetic field. The communication in the transponder-to-terminal direction is generally performed by modulation (retromodulation) of the load formed by the circuits of the transponder on the oscillating circuit thereof. For simplification, the amplitude and/or phase detection (demodulation) and retromodulation circuits have not been detailed, the described embodiments being compatible with usual demodulation and retromodulation circuits.

In certain applications, the transponder extracts from the electromagnetic field the power necessary for the electronic circuit that it comprises.

One of the operating constraints of a transponder is that the voltage sampled across the oscillating circuit is likely to strongly vary according to the coupling between the antennas of the oscillating circuits of the terminal and of the transponder, the coupling being, among others, a function of the distance separating the oscillating circuits from each other.

Figure 2:
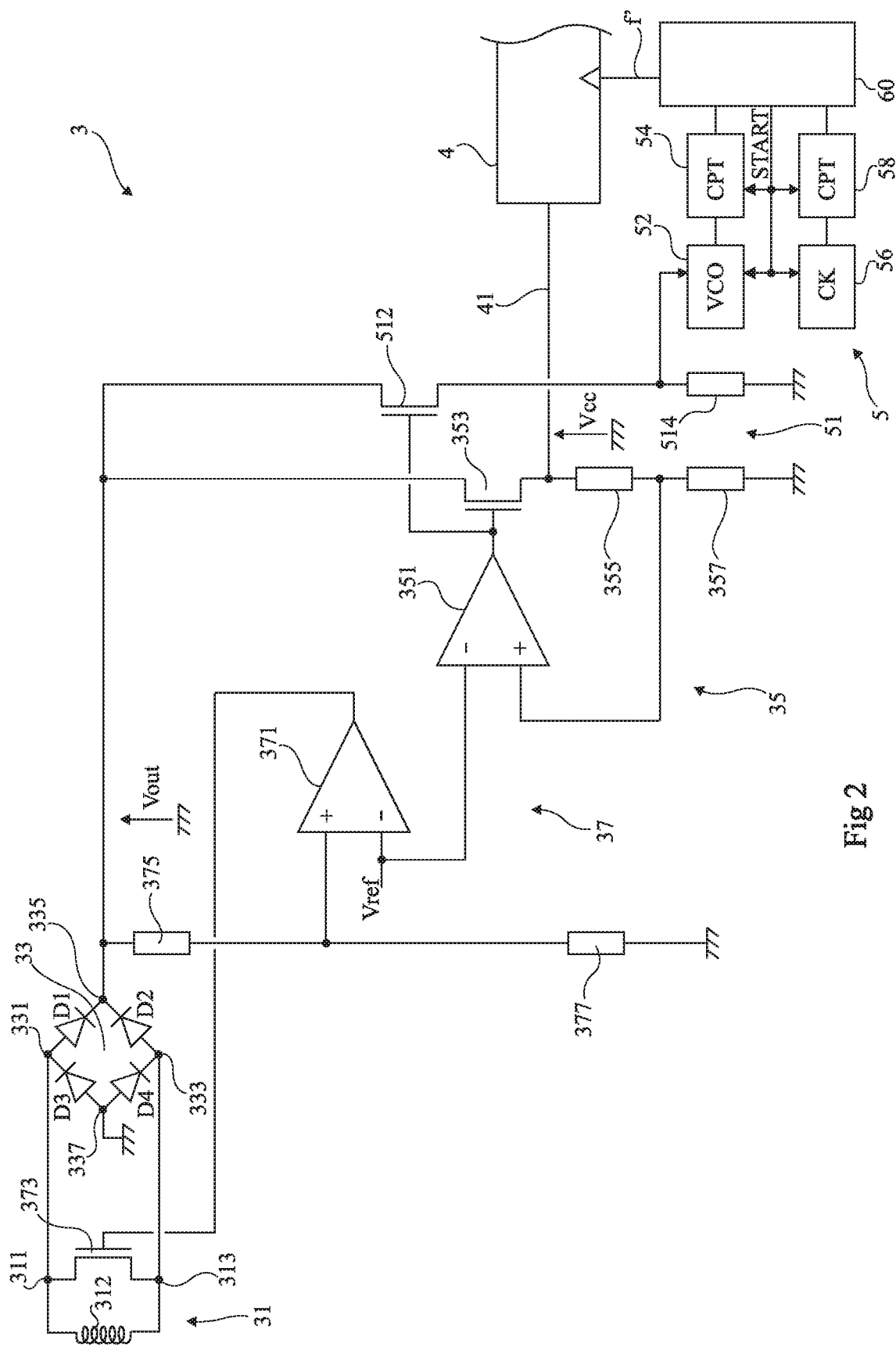
FIG. 2 very schematically shows in the form of blocks an embodiment of a near-field communication device.

FIG. 2 very schematically shows in the form of blocks an embodiment of a near-field communication device 3. The device forms a transponder or the transponder (or card) portion of a mixed device.

Device 3 for example equips one of devices 1 and 2 of FIG. 1, or both.

Transponder 3 comprises an oscillating circuit 31 having an inductive element, formed of an antenna 312, intended to detect an electromagnetic field. In the example of FIG. 2, it is assumed that a capacitive element of the oscillating circuit is formed by stray capacitances. As a variation, a capacitor (for example, having a variable capacitance to adjust the tuning of the oscillating circuit) is connected in parallel with antenna 312.

Terminals 311 and 313 of the oscillating circuit, corresponding to the terminals of antenna 312, are coupled, preferably connected, to the AC input terminals 331 and 333 of a rectifying bridge 33 having rectified output terminals 335 and 337 supplying a DC voltage Vout intended to power the electronic circuits of the transponder. Terminal 337 defines, in the shown example, a reference potential (the ground). A capacitor (not shown) for smoothing voltage Vout is generally present between terminals 335 and 337. Rectifying bridge 33 is, according to embodiments, half-wave or fullwave. In the example of FIG. 2, the case of a fullwave bridge having two diodes D1 and D2 respectively connecting terminals 331 and 333 to terminal 335 with their cathodes on the side of terminal 335 and having two diodes D3 and D4 respectively connecting terminals 331 and 335 to terminal 337 with their anodes on the side of terminal 337 is considered.

Output voltage Vout of rectifying bridge 33 is regulated by a linear regulator 35, or shunt regulator. In the simplified example shown in FIG. 2, regulator 35 is based on an analog comparator 351 of information representative of a voltage Vcc with respect to a reference voltage Vref. Voltage Vcc forms an output voltage used to power one or a plurality of electronic circuits of the transponder, symbolized by a block 4 in FIG. 2. In the example illustrated in FIG. 2, comparator 351 drives (is coupled to, preferably connected to) the gate of a MOS transistor 353 coupling, preferably connecting, terminal 335 to a terminal 41 supplying potential Vcc (assumed to be referenced with respect to ground 337). An input, for example direct + (non-inverting), of comparator 351 receives information representative of voltage Vcc while its other input (inverting −) receives reference voltage Vref. Reference voltage Vref is for example supplied by a bandgap-type circuit. For example, the junction point of a series association of two resistors 355 and 357, connecting terminals 41 and 337 and forming a resistive dividing bridge, is connected to terminal + of comparator 351.

According to the applications targeted by the present disclosure, circuits 4 of the transponder preferably comprise, among others, digital circuits driven at a frequency f.

In such applications, it may be desirable to estimate or to measure the average power consumption of the transponder circuits. Such an estimation may for example enable to adjust the operating frequency of circuits 4 to modify their power consumption according, for example, to the available power.

It could have been devised to use a capacitive element connected to the output of the rectifying bridge to calculate such an average. However, unless capacitive elements of high values, which are thus very (too) bulky, are provided, the recovered information is more representative of an instantaneous power consumption than of an average power consumption.

According to the described embodiments, it is provided to use a voltage-controlled oscillator (VCO) to provide information relative to the instantaneous power consumption of the circuits and to estimate the frequency of the generated oscillations with respect to a reference frequency. To achieve this, a particularly simple solution is to count the output pulses of the voltage-controlled oscillator as well as pulses of a reference clock signal. A variation of the average consumption can then easily be estimated.

In the embodiment of FIG. 2, it is provided to copy the output information of comparator 351 of linear regulator 35 (shunt regulator) to control a voltage controlled oscillator 52 (VCO) of an estimation circuit 5. For example, the output of comparator 351 also drives the gate of a MOS transistor 512 of a copying stage 51, transistor 512 being series-connected with a resistive element 514 between terminals 335 and 337. The junction point of the series association of transistor 512 and of resistor 514 controls oscillator 52. Oscillator 52 is powered either directly with its control voltage, or with voltage Vcc supplied to circuits 4. The output of oscillator 52 increments or decrements a counter 54 (CPT). Oscillator 52 and counter 54 form a path of estimation of voltage Vout.

A reference path comprises a counter 58 (CPT) incremented by a reference clock signal CK (block 56). Signal CK is supplied, for example, by an oscillator of fixed frequency comprised within transponder 3. In most near-field communication devices, circuits 4 including a clock signal which is fixed or may be used as a reference. For example, the signal is extracted from the carrier of the radio frequency field detected by the transponder. According to another example, signal CK is supplied by a ring digital oscillator comprised by the circuits.

The respective outputs of counters 54 and 58 are used to estimate voltage Vout. More particularly, the count, supplied by counter 58, provides a reference enabling to interpret the value supplied by counter 54.

Indeed, the more the power consumption of circuit 4 increases, the more the output of comparator 351 decreases and the more the frequency of voltage-controlled oscillator 52 increases. Conversely, if the power consumption decreases, the frequency of oscillator 52 decreases.

In the shown embodiment, a circuit 60 of interpretation of the respective counts of counters 54 and 58 is provided. Circuit 60 also preferable supplies a start signal START resetting counters 54 and 58 and, if need be, blocks 52 and 56 to start an estimation.

The interpretation of the values of counters 54 and 58 may take different forms. For example, circuit 6o may compare, at the end of a time interval set by counter 58, the value supplied by counter 54 with stored values representative of the power consumption. According to another example, the estimation is performed by range of values of counter 58.

The result output by circuit 60 may be processed by circuits 4 of the transponder either for information purposes, or for functional purposes. For example, circuit 6o uses the information provided by counter 54 to adjust frequency f of operation of circuits 4 and, thereby, vary their power consumption. This enables to optimize the power consumption according to the available power.

Counters 54 and 58 may be use for counting or down-counting.

According to an embodiment where the counters are used in down-counting, said counters are initialized to a determined value and the down-counting time of counter 58 (which is known since the frequency of signal CK is determined) enables to interpret the value output by counter 54 when counter 58 reaches zero. According to this embodiment, the initial value at which the counters, and more particularly counter 58, are loaded, determines the time period over which the power consumption of circuits 4 is averaged.

According to another embodiment, each time an estimation starts, counters 54 and 58 are reset to zero and the value reached by counter 54 when counter 58 reaches a given count, which is a function of the desired average time period, is taken into account.

According to another embodiment, counters 54 and 58 operate in reverse directions. For example, counter 54 is incremented while counter 58 is decremented. The estimation of the value carried by counter 58 is then performed when counter 58 reaches zero.

In an application other than to transponders, terminal 335 represents the terminal of the power supply voltage of circuits 45 having a power consumption which is desired to be estimated or controlled.

In the application to transponders, transponder 3 also comprises, preferably, a circuit 37 of protection against overvoltages. Circuit 37 comprises an analog comparator 371 of information representative of voltage Vout (and thus of the non-regulated voltage) at the output of rectifying bridge 33 with respect to reference voltage Vref. In the example illustrated in FIG. 2, comparator 371 drives (is coupled to, preferably connected to) the gate of a MOS transistor 373 coupling, preferably connecting, terminals 311 and 313 of the oscillating circuit. An input, for example direct+(non-inverting), of comparator 371 receives information representative of voltage Vout while its other input (inverting −) receives a reference voltage Vref. Reference voltage Vref is for example the same as that used by comparator 351. For example, the junction point of two resistors 375 and 377, connecting terminals 335 and 337 and forming a resistive dividing bridge, is connected to terminal + of comparator 371. The function of circuit 37 is to modulate the value of the on-state drain source resistance of transistor 373 to limit (clip) the overvoltage across the antenna to a value selected according to the voltage that the circuits connected downstream can withstand. Thus, only transistor 373 and, possibly, the capacitor of the oscillating circuit, need to withstand overvoltages, the rest of the circuits only seeing a limited voltage. Structurally, circuit 37 has the same structure as a shunt regulator.

Figure 3:
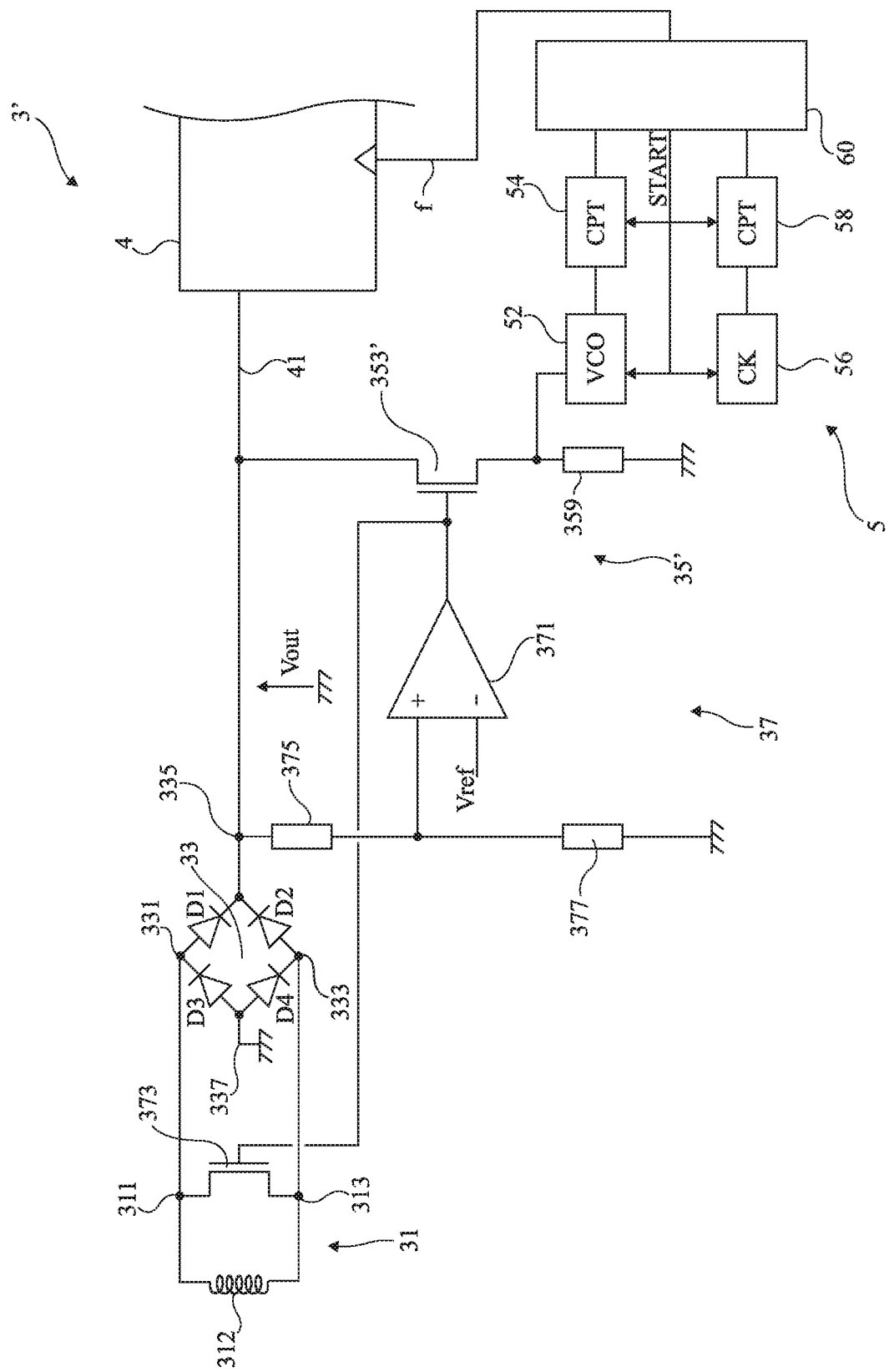
FIG. 3 very schematically shows in the form of blocks another embodiment of a near-field communication device.

FIG. 3 very schematically shows in the form of blocks another embodiment of a transponder 3' using a circuit of estimation or of measurement of the power consumption of circuits 4 powered with a voltage Vcc, extracted from a voltage Vout.

Although the example of FIG. 3 takes an example of electromagnetic transponder, as for the embodiment of FIG. 2, it more generally applies to a digital estimation of the power consumption of an electronic circuit.

The example of FIG. 3 comprises oscillating circuit 31, rectifying bridge 33, and protection circuit 37.

However, in the embodiment of FIG. 3, circuits 4 are directly powered with output voltage Vout of the rectifying bridge (preferably smoothed by a capacitor, not shown). Thus, terminal 41 is coupled, preferably connected, to terminal 335.

According to this embodiment, the regulation of voltage Vout is directly obtained by varying operating frequency f of the digital circuits of the transponder. Thus, voltage-controlled oscillator 52, analogically controlled, is controlled and powered by the output of a linear regulator (or shunt regulator) 35'. In the example of FIG. 3, regulator 35' comprises a MOS transistor 353' series-connected with a resistor 359 between terminals 335 and 337, their junction point supplying the control and the power supply of oscillator 52 of measurement circuit 5.

Measurement circuit 5 is, for the rest, similar to that described in relation with FIG. 2.

As a variation, another comparator (not shown) is provided to control transistor 353' by sampling information from voltage Vout to control it.

An advantage of the described embodiments is that they allow an average digital measurement of the power consumption of an electronic circuit.

Another advantage is that the described solution is, for a given average time period, much less bulky than a solution with a filtering capacitor.

Another advantage of the described embodiments is that they are compatible with an operation of a transponder in different power modes. The longer the desired time period over which the average power consumption is averaged, the more advantageous the described counter-based solution.

Another advantage of the described embodiments is that they enable to optimize the power consumption of an electromagnetic transponder.

Different types of voltage-controlled oscillators may be used for oscillator 52. Preferably, a ring oscillator which has the advantage of simplicity and of avoiding the use of an inductive component is used.

According to an embodiment, circuit 60 uses reference clock signal CK to generate the start or activation signal (START). Such a signal enables to synchronize the starting of the two counters. According to the desired average time period, circuit 60 deactivates signal START (reverses the state) to stop the counters. Block 60 may then for example subtract the value of the reference counter from that of the estimation counter. Such a difference may then be used by the embarked program to estimate the power consumption.

According to another embodiment, block 60 may generate an interrupt when the value of the estimation counter exceeds a given programmable threshold. Such an interrupt is then used to detect too high a power consumption of the circuit.

According to an example of application of the estimation of the average power consumption, it is provided to adjust frequency f of operation of circuits 4 of the transponder according to voltage Vout sampled across the oscillating circuit. Such an adjustment enables to adapt the power consumption of the transponder to the available power. Indeed, the higher the frequency f at which the digital circuits 4 of transponder 3 are driven, the more power said circuits consume and the more they take part in decreasing the overvoltage across oscillating circuit 31.

Conversely, decreasing basic operating frequency f of digital circuits 4 of transponder 3 when the voltage sampled across the antenna decreases enables to preserve the remote supply of the transponder with no loss of communication. Thus, adjusting the operating frequency optimizes the efficiency by taking advantage of the maximum possible power while preserving a protection of circuits against too high voltages. Actually, circuits 4 of transponder 3 form part of the load of oscillating circuit 31. Their power consumption thus has an influence upon the voltage across oscillating circuit 31. Increasing the operating frequency, and thus the power consumption, of circuits 4 decreases the voltage across circuit 31. Less power is thus lost by dissipation in transistor 373 (or another equivalent shunt circuit).

Various embodiments and variations have been described. It will be understood by those skilled in the art that certain features of these various embodiments and variations may be combined, and other variations will occur to those skilled in the art. In particular, the selection of the operating frequencies of the transponder depends on the application.

Finally, the practical implementation of the described embodiments and variations is within the abilities of those skilled in the art based on the functional indications given hereinabove. In particular, other assemblies for supplying the control (or power supply) voltage of the voltage-controlled oscillator may be provided.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device comprising:
   an electronic circuit;
   a voltage-controlled oscillator configured to receive information representative of a power supply voltage of the device, the voltage-controlled oscillator coupled to the electronic circuit;
   a first counter configured to count pulses supplied by the voltage-controlled oscillator, wherein the device is configured to estimate an average power of the electronic circuit based on the pulses counted by the first counter;
   a second counter configured to count pulses of a clock signal; and
   a comparator having a first input coupled to a reference voltage terminal and a second input coupled to receive information representative of the power supply voltage.

2. The device of claim 1, further comprising digital interpretation circuit configured to compare outputs of the first and second counters.

3. The device of claim 1, wherein the second counter is configured to output a reference count.

4. The device of claim 1, wherein the device is configured to estimate the average power over a time period that is based on pulses counted by the second counter.

5. The device of claim 1, further comprising:
   an oscillating circuit; and
   a rectifying bridge configured to rectify a voltage across the oscillating circuit, wherein the voltage-controlled oscillator is configured to be powered and controlled with a voltage that is a function of an output voltage of the rectifying bridge.

6. The device of claim 5, further comprising a regulation circuit configured to regulate the output voltage of the rectifying bridge.

7. The device of claim 5, further comprising a voltage-limiting circuit coupled across the oscillating circuit.

8. The device of claim 7, wherein the oscillating circuit comprises an antenna, and wherein the voltage-limiting circuit is coupled directly across terminals of the antenna.

9. A near-field communication device comprising:
a voltage regulator;
a voltage-controlled oscillator coupled to the voltage regulator;
a fixed frequency oscillator;
a first counter coupled to an output of the voltage-controlled oscillator;
a second counter coupled to an output of the fixed frequency oscillator; and
a digital near-field communication circuit having a supply voltage terminal coupled to the voltage regulator and a clock input coupled to receive a clock signal based on the output of the voltage-controlled oscillator.

10. The device of claim 9, further comprising an oscillating circuit and a rectifying bridge coupled across terminals of the oscillating circuit, the voltage regulator coupled to an output of the rectifying bridge.

11. The device of claim 9, further comprising digital interpretation circuit configured to compare outputs of the first and second counters.

12. The device of claim 9, wherein the device is configured estimate an average power of the digital near-field communication circuit based on pulses counted by the first counter.

13. The device of claim 12, wherein the device is configured to estimate the average power over a time period that is based on pulses counted by the second counter.

14. A method comprising:
powering a voltage-controlled oscillator with a first voltage based on a circuit voltage;
powering an electronic circuit with a second voltage based on the circuit voltage;
clocking the electronic circuit with a clock signal generated from an output of the voltage-controlled oscillator; and
estimating a power consumption of the electronic circuit by estimating a frequency of the output of the voltage-controlled oscillator,
wherein the estimating comprises counting pulses based on the output of the voltage-controlled oscillator and comparing the count of the pulses based on the output of the voltage-controlled oscillator with a reference count.

15. The method of claim 14, wherein the first voltage is the same as the second voltage.

16. The method of claim 14, further comprising rectifying an input signal to generate the circuit voltage.

17. The method of claim 16, further comprising regulating the rectified input signal to generate the first voltage and regulating the rectified input signal to generate the second voltage.

18. The method of claim 16, wherein the first voltage and the second voltage are the same, the first and second voltages being generated by regulating the rectified input signal to generate the second voltage.

19. The method of claim 16, further comprising receiving the input signal from an antenna.

20. The method of claim 14, further comprising voltage-limiting the circuit voltage.

* * * * *